US012622192B2

(12) United States Patent
Yong et al.

(10) Patent No.: US 12,622,192 B2
(45) Date of Patent: May 5, 2026

(54) METHODS OF SELECTIVELY ETCHING SILICON NITRIDE

(71) Applicant: Applied Materials, Inc., Santa Clara, CA (US)

(72) Inventors: Doreen Wei Ying Yong, Singapore (SG); Tuck Foong Koh, Singapore (SG); Mikhail Korolik, San Jose, CA (US); John Sudijono, Singapore (SG); Paul E. Gee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 214 days.

(21) Appl. No.: 18/223,382

(22) Filed: Jul. 18, 2023

(65) Prior Publication Data

US 2025/0069894 A1 Feb. 27, 2025

(51) Int. Cl.
*H10P 50/28* (2026.01)

(52) U.S. Cl.
CPC .................................. *H10P 50/283* (2026.01)

(58) Field of Classification Search
None
See application file for complete search history.

(56) References Cited

U.S. PATENT DOCUMENTS 9,716,195 B2 7/2017 Gershon et al.
10,177,002 B2 1/2019 Bajaj et al.
2016/0064233 A1 3/2016 Wang et al.
2018/0286707 A1 10/2018 Hudson et al.
2019/0206697 A1 7/2019 Eason et al.
2020/0098586 A1* 3/2020 Xia .................. H01J 37/32357
2021/0005472 A1* 1/2021 Kanarik ............ H01L 21/67109
2021/0020454 A1 1/2021 Kal et al.
(Continued)

FOREIGN PATENT DOCUMENTS

WO 2017189482 A1 11/2017
WO WO-2018195426 A1 * 10/2018 ........ H01J 37/32357

OTHER PUBLICATIONS

Wikipedia "Hydrogen Sulfide" via https://en.wikipedia.org/wiki/Hydrogen_sulfide (Year: 2025).*
(Continued)

*Primary Examiner* — Binh X Tran
(74) *Attorney, Agent, or Firm* — SERVILLA WHITNEY LLC

(57) ABSTRACT

Embodiments of the present disclosure are directed to selective etching processes. The processes include flowing a precursor comprising one or more of an interhalogen, a halogen-containing species, a pseudohalogen species, a mixture of one or more of the interhalogen, the halogen-containing species, or the pseudohalogen species and an amine or a phosphine, or a mixture of one or more of the interhalogen, the halogen-containing species, or the pseudohalogen species with a sulfur-containing species, into a semiconductor processing chamber containing a substrate, and forming an activated species of the precursor to etch a substrate. The substrate has a plurality of alternating layers of silicon oxide and silicon nitride thereon and a trench formed through the plurality of alternating layers. The silicon nitride layers are selectively etched relative to the silicon oxide layers at an etch selectivity of greater than or equal to 500:1.

19 Claims, 3 Drawing Sheets

(56) References Cited

U.S. PATENT DOCUMENTS

| | | | | |
|---|---|---|---|---|
| 2021/0082709 | A1* | 3/2021 | Tomura | H01L 21/6831 |
| 2021/0111033 | A1* | 4/2021 | Korolik | H01J 37/32633 |
| 2021/0335626 | A1 | 10/2021 | Xue et al. | |
| 2022/0068657 | A1* | 3/2022 | Takeya | H01L 21/67069 |
| 2022/0246436 | A1 | 8/2022 | Wang et al. | |
| 2022/0254645 | A1 | 8/2022 | Luan et al. | |
| 2022/0293430 | A1* | 9/2022 | Korolik | H01J 37/3244 |
| 2023/0044406 | A1 | 2/2023 | Sinha et al. | |
| 2023/0109912 | A1 | 4/2023 | Chua et al. | |
| 2023/0207328 | A1 | 6/2023 | Musselwhite et al. | |
| 2024/0120210 | A1* | 4/2024 | Korolik | H01L 21/3065 |
| 2024/0420962 | A1* | 12/2024 | Yong | H01J 37/32816 |
| 2025/0118568 | A1* | 4/2025 | Church | H10B 43/50 |
| 2025/0232983 | A1* | 7/2025 | Fukui | H01L 21/31116 |

OTHER PUBLICATIONS

Wikipedia, "Sufanyl" via https://en.wikipedia.org/wiki/Sulfanyl (Year: 20).*

"PCT International Search Report and Written Opinion in PCT/US2024/034005 dated Oct. 4, 2024, 10 pages".

"PCT International Search Report and Written Opinion in PCT/US2024/037975 dated Oct. 31, 2024, 10 pages".

U.S. Appl. No. 18/210,918, filed Jun. 16, 2023, 47 pages.

Cheng, C. C., et al., "Atomic Hydrogen Driven Halogen Extraction from Si(100)—Eley-Rideal Surface Kinetics", Office of Naval Research, prepared for publication in the J. Am. Chem. Soc., (1991), 23 pages.

Ibbotson, D. E., et al., "Plasmaless dry etching of silicon with fluorine-containingcompounds", Journal of Applied Physics 56, 2939-2942 (1984).

Jackman, R. B., et al., "Semiconductor Surface Etching by Halogens: Fundamental Steps", Applied Surface Science 36 (1989), 296-312.

Kanarik, Keren J., et al., "Overview of atomic layer etching in the semiconductor industry", Journal of Vacuum Science & Technology A, 2nd Series, vol. 33, No. 2 (2015).

Lee, Seungjin , et al., "Amine-Based Passivating Materials for Enhanced Optical Properties and Performance of Organic-Inorganic Perovskites in Light-Emitting Diodes", J. Phys. Chem. Lett. 2017, 8, 8, 1784-1792.

Nakane, Kazuya , et al., "In situ monitoring of surface reactions during atomic layer etching of silicon nitride using hydrogen plasma and fluorine radicals", ACS Appl. Mater. Interfaces 2019, 11, 40, Supporting Information, 4 pages.

Raichoudhury, P., et al., "Hydrogen Sulfide as an Etchant for Silicon", J. Electrochem. Soc., vol. 116, No. 4, 539-541.

Shih, Minliang , et al., "Decomposition of SF6 and H2S Mixture in Radio Frequency Plasma Environment", Ind. Eng. Chem. Res. 2003, 42, 2906-2912.

"PCT International Search Report and Written Opinion in PCT/US2025/048915 dated Jan. 27, 2026, 9 pages".

* cited by examiner

METHODS OF SELECTIVELY ETCHING SILICON NITRIDE

TECHNICAL FIELD

Embodiments of the present disclosure relate to the field of semiconductor manufacturing. More particularly, embodiments of the disclosure relate to selectively etching silicon nitride relative to silicon oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes, including transferring a pattern in photoresist into underlying layers, thinning layers, or thinning lateral dimensions of features already present on the surface. Chemical etching processes typically include chemistries that etch one material faster than another facilitating, for example, a pattern transfer process. Such an etch process is said to be selective to the first material. As a result of the diversity of materials, circuits, and processes, etch processes have been developed with a selectivity towards a variety of materials.

The fabrication of three-dimensional (3D)-NAND devices includes the formation of alternating silicon oxide (e.g., $SiO_2$) layers and silicon nitride (e.g. $Si_3N_4$) layers. After the formation of the stack of alternating layers, the silicon nitride layers are selectively etched to form recesses that are ultimately filled with a conductor (e.g., tungsten).

Etch processes may be termed "wet" or "dry" based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge. There is a need for improved systems and methods that can be used to produce high quality devices and structures.

Currently, a wet etching process is used to selectively remove the silicon nitride layers. However, in the drying process after the wet etching process, the suspended silicon oxide layers may collapse due to surface tension of the liquid. This leads to yield losses. Another issue with wet etching processes is that with future scaling of the 3D-NAND devices, the number of layers of silicon oxide and silicon nitride increases. This is problematic because the liquid etchant will have difficulty filling into a deeper trench. This results in non-uniform etching, such that the etching of the top of the 3D-NAND structure is different than the etching of the bottom of the 3D-NAND structure.

Current dry etching techniques also etch silicon and silicon oxide, in addition to silicon nitride, thereby reducing selectivity of such processes. Accordingly, there is a need for improved etch processes that achieve improved etching selectivity.

SUMMARY

One or more embodiments of the present disclosure are directed to a selective etch method. The selective etch method comprises flowing a precursor comprising one or more of an interhalogen, a halogen-containing species, a pseudohalogen species, a mixture of one or more of the interhalogen, the halogen-containing species, or the pseudohalogen species and an amine or a phosphine, or a mixture of one or more of the interhalogen, the halogen-containing species, or the pseudohalogen species and a sulfur-containing species, into a semiconductor processing chamber containing a substrate. The substrate has a plurality of alternating layers of silicon oxide and silicon nitride thereon and a trench formed through the plurality of alternating layers. The selective etch method further comprises forming an activated species of the precursor and etching the substrate. The silicon nitride layers are selectively etched relative to the silicon oxide layers.

Additional embodiments of the present disclosure are directed to a method of selectively etching silicon nitride relative to silicon oxide. The method comprises flowing a precursor comprising one or more of an interhalogen, a halogen-containing species, a pseudohalogen species, a mixture of one or more of the interhalogen, the halogen-containing species, or the pseudohalogen species and an amine or a phosphine, or a mixture of one or more of the interhalogen, the halogen-containing species, or the pseudohalogen species and a sulfur-containing species, into a semiconductor processing chamber containing a substrate. The substrate has a plurality of alternating layers of silicon oxide and silicon nitride thereon and a trench formed through the plurality of alternating layers. The method further comprises forming an activated species of the precursor and etching the substrate. The silicon nitride layers are selectively etched relative to the silicon oxide layers at an etch selectivity of greater than or equal to 500:1. In some embodiments, the semiconductor processing chamber is maintained at a pressure in a range of from 5 millitorr to 100 Torr and a temperature of less than or equal to 500° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1B:
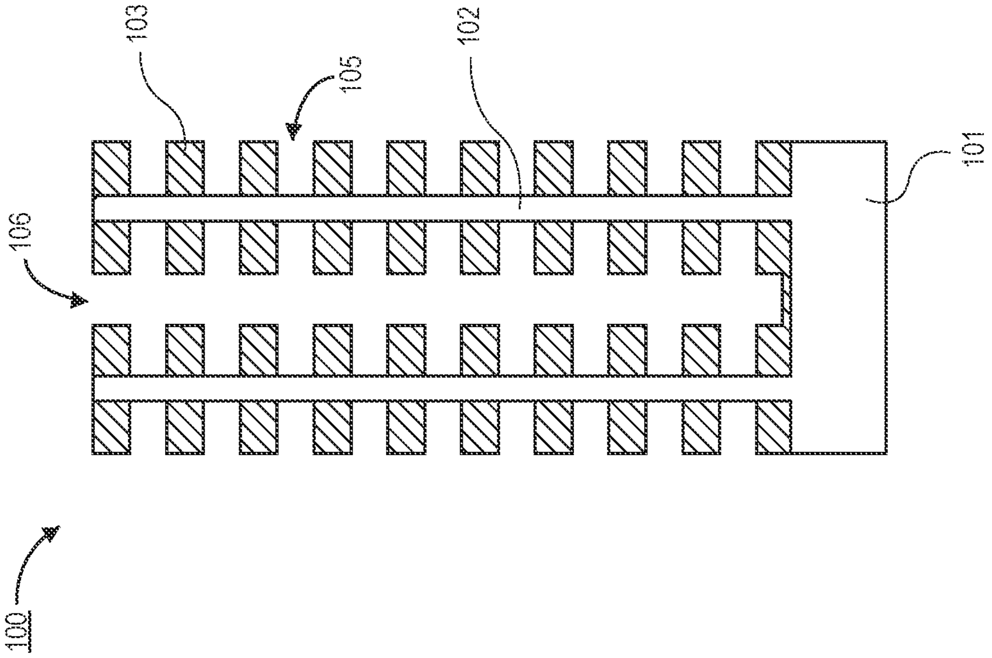
FIG. 1B illustrates a cross-sectional view of a portion of the 3D-NAND structure of FIG. 1A after selectively etching the silicon nitride layers, in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" (also referred to as a "wafer") as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

In transitioning from 2D-NAND to 3D-NAND, many process operations are modified from vertical to horizontal operations. Additionally, as 3D-NAND structures grow in the number of cells being formed, the aspect ratios of memory holes and other structures increase, sometimes dramatically. During 3D-NAND processing, stacks of placeholder layers and dielectric materials may form the inter electrode dielectric or IPD layers. These placeholder layers may have a variety of operations performed to place structures before fully removing the material and replacing it with metal. While the metallization may be incorporated on one side of the cell structure, operations may have previously been performed on the other side of the structure, such as forming floating gates or charge-trap layers. Although these layers may be formed within the memory hole, cross talk between vertically separated memory cells may occur. One way to reduce this communication includes etching the placeholder material before forming these layers to allow dielectric material to further separate the individual cell material layers from adjacent cells.

The fabrication of 3D-NAND devices includes the formation of alternating silicon oxide layers and silicon nitride layers. After the formation of the stack of alternating layers, the silicon nitride layers are selectively etched to form recesses that are ultimately filled with a conductor (e.g., tungsten).

Currently, a wet etching process is used to selectively remove the silicon nitride layers. However, in the drying process after the wet etching process, the suspended silicon oxide layers may collapse due to surface tension of the liquid. This leads to yield losses. Another issue with wet etching processes is that with future scaling of the 3D-NAND devices, the number of layers of silicon oxide and silicon nitride increases. This is problematic because the liquid etchant will have difficulty filling into a deeper trench. This results in non-uniform etching, such that the etching of the top of the 3D-NAND structure is different than the etching of the bottom of the 3D-NAND structure.

Accordingly, wet etching of 3D-NAND structures remains a challenge, especially as devices continue to scale to include larger stacks of alternating silicon oxide layers and silicon nitride layers. Current dry etching techniques also etch silicon and silicon oxide, in addition to silicon nitride, thereby reducing selectivity of such processes.

Embodiments of the present disclosure advantageously provide improved etch processes including a plurality of chemistries that, when implemented together in a process cycle, achieve improved etching selectivity.

Without intending to be bound by theory, it is thought that the plurality of chemistries, when implemented together in a process cycle, achieve improved uniformity and/or increased etch rate, depending on the process parameters. The skilled artisan may optimize process parameters in order to achieve improved uniformity and/or increased etch rate using the plurality of chemistries of the present disclosure.

Embodiments of the disclosure provide an etching chemistry, e.g., a precursor, comprising one or more of an interhalogen, a halogen-containing species, or a pseudohalogen species. In some embodiments, the use of the precursor comprising one or more of the interhalogen, the halogen-containing species, or the pseudohalogen species constitutes a dry etching process. As such, there is no post-etch drying step that could potentially damage the resulting structures.

Additional embodiments provide a precursor comprising a mixture of an etching chemistry and a passivating chemistry. In some embodiments, the precursor comprises one or more of the interhalogen, the halogen-containing species, or the pseudohalogen species with an amine or a phosphine, or one or more of the interhalogen, the halogen-containing species, or the pseudohalogen species with a sulfur-containing species.

In embodiments where the precursor comprises a mixture of the interhalogen and the amine or the phosphine, a mixture of the interhalogen and the sulfur-containing species, a mixture of the halogen-containing species and the amine or the phosphine, a mixture of the halogen-containing species and the sulfur-containing species, a mixture of the pseudohalogen and the amine or the phosphine, or a mixture of the pseudohalogen and the sulfur-containing species, each of the interhalogen, the halogen-containing species, and the pseudohalogen constitutes an etching chemistry and each of the amine, phosphine, and sulfur-containing species constitute a passivating chemistry.

Embodiments of the disclosure provide forming an activated species of the precursor. In some embodiments, forming the activated species comprises one or more of a thermal process, generating a plasma of the precursor, or heating the substrate to a temperature of less than or equal to 500° C. using an optical radiation source.

Embodiments of the disclosure advantageously provide etching chemistries and passivating chemistries that, when implemented together in a process cycle and activated to form an activated species, achieve improved etching selectivity.

The embodiments of the disclosure are described by way of the Figures, which illustrate devices (e.g., a portion of a 3D-NAND structures) and processes for forming portions of the 3D-NAND structures in accordance with one or more embodiments of the disclosure. The processes shown are merely illustrative possible uses for the disclosed processes, and the skilled artisan will recognize that the disclosed processes are not limited to the illustrated applications.

In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Figure 1A:
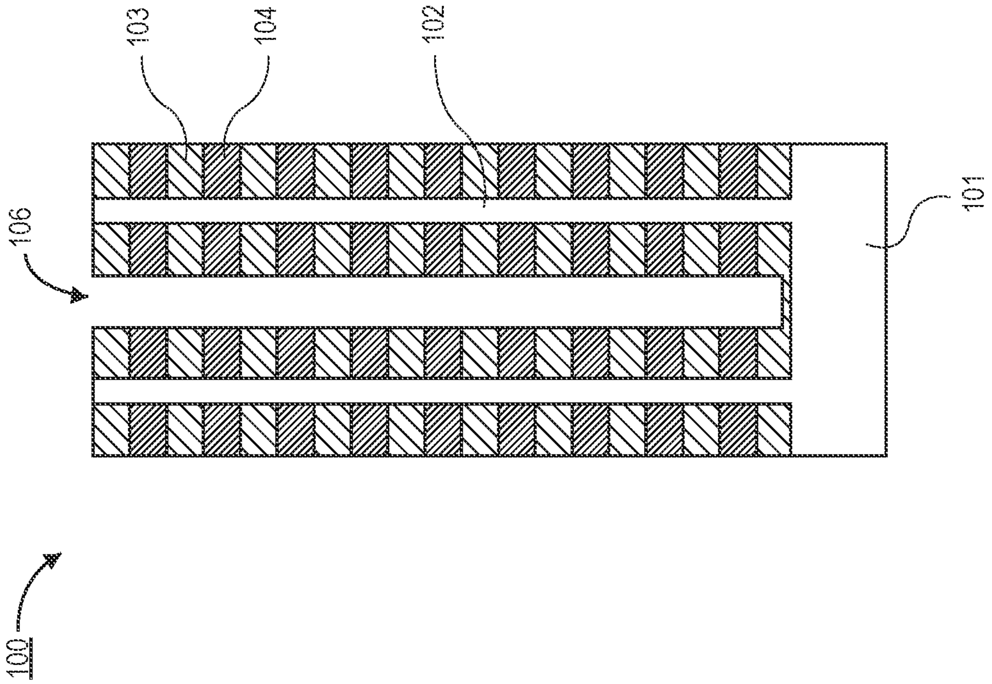
FIG. 1A illustrates a cross-sectional view of a portion of a 3D-NAND structure with alternating silicon oxide layers and silicon nitride layers, in accordance with one or more embodiments of the disclosure.

FIG. 1A illustrates a cross-sectional view of a portion of a 3D-NAND structure with alternating silicon oxide layers and silicon nitride layers. FIG. 1B illustrates a cross-sectional view of a portion of the 3D-NAND structure of FIG. 1A after selectively etching the silicon nitride layers.

In one or more embodiments, the methods described herein are implemented on a 3D structure 100. For example, the 3D structure 100 may be a structure used for a 3D-NAND device. The 3D structure 100 includes a substrate 101, such as a polysilicon substrate, with polysilicon pillars 102 extending up from the substrate 101. In one or more embodiments, each pillar 102 is lined by alternating layers of silicon oxide (e.g., $SiO_X$) 103 and silicon nitride (e.g., $Si_XN_Y$) 104. The sidewalls of the silicon nitride layers 104 and the silicon oxide layers 103 may be exposed by a trench 106 that passes through the layers between the pillars 102.

In some embodiments, the silicon nitride layers 104 are sacrificial layers. In embodiments where the silicon nitride layers 104 are sacrificial layers, the silicon nitride layers 104 are etched away, as shown in FIG. 1B. The removal of the silicon nitride layers 104 results in the formation of recesses 105 between the silicon oxide layers 103. In some embodiments, the recesses 105 are subsequently filled with a conductive layer (not shown) comprising any suitable conductive material known to the skilled artisan, such as tungsten (W).

Advantageously, embodiments of the present disclosure utilize etching chemistries that provide a high etch selectivity of the silicon nitride layers 104 relative to the silicon oxide layers 103. Embodiments of the present disclosure advantageously increase the etching rate of silicon nitride and thereby reduce the time needed to etch the silicon nitride layers 104. Embodiments of the present disclosure include using optical radiation or a plasma source, such as a modular microwave source, to generate an activated species of the precursor which includes an etching chemistry, and in some embodiments, also includes a passivating chemistry.

In FIGS. 1A and 1B, the structure 100 is shown as being suitable for a 3D-NAND device. The use of the etching processes described herein are particularly beneficial for use in 3D-NAND devices. In one or more embodiments, the etching uniformity in highly scaled 3D-NAND devices, such as in structures with high aspect ratios and many silicon nitride layers 104 and silicon oxide layers 103, is substantially uniform at the top of the structure and the bottom of the structure. Additionally, the etching processes of one or more embodiments provides complete removal of the silicon nitride layers 104 without significantly damaging the silicon oxide layers 103. In some embodiments, the passivating chemistry forms a passivation layer over the exposed portions of the silicon oxide layers 103 to protect the silicon oxide layers 103. As used herein, each of the amine, phosphine, and sulfur-containing species may independently be referred to as a "passivation chemistry" or a "passivating chemistry." In specific embodiments, the etching processes of one or more embodiments provides complete removal of the silicon nitride layers 104 without damaging the silicon oxide layers 103 having the passivation layer thereon.

It will be appreciated by the skilled artisan that embodiments of the present disclosure are not limited to the etching of 3D-NAND structures. For example, similar etching processes may be used wherever a silicon nitride structure needs to be etched selectively to a silicon oxide layer. For example, a silicon nitride layer may be provided over a silicon oxide layer, with the disclosed etching processes etching through the silicon nitride layer and stopping on the oxide layer. In such an embodiment, the silicon oxide layer may be considered an etch stop layer.

While examples of specific semiconductor device architectures that benefit from the use of a plasma source, such as a modular microwave source, to generate a microwave plasma of the precursor, are provided, it will be appreciated by the skilled artisan that the provided examples are non-limiting, and there may be many different applications and architectures that benefit from the etching chemistry and passivating chemistry in accordance with one or more embodiments herein.

Figure 2:
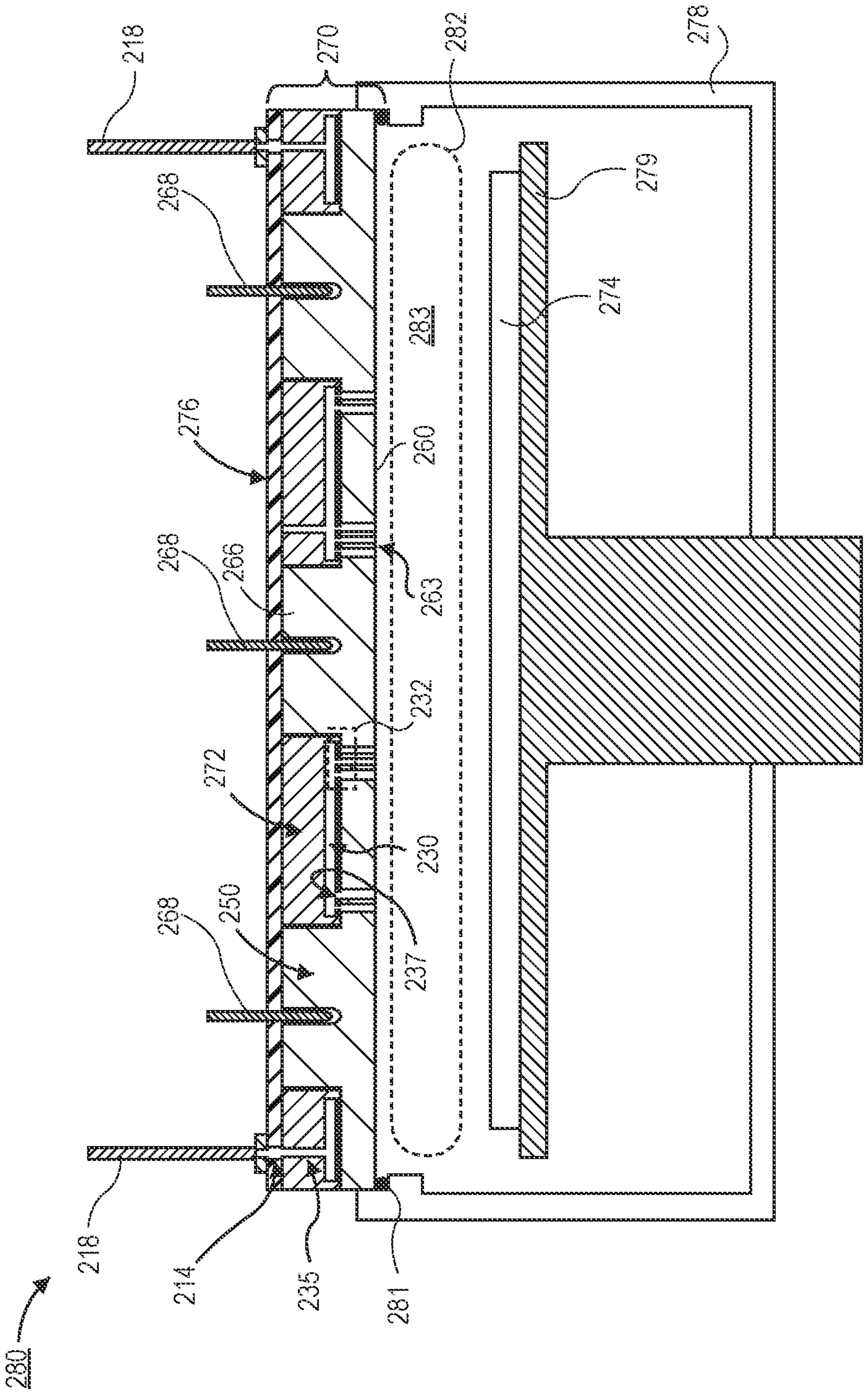
FIG. 2 illustrates a cross-sectional schematic view of a microwave plasma chamber for dry etching a 3D-NAND structure, in accordance with one or more embodiments of the disclosure.

FIG. 2 illustrates a cross-sectional view of a processing tool 280, e.g., a microwave plasma chamber, which includes an assembly 270, in accordance with one or more embodiments of the disclosure.

It will be understood by the skilled artisan that while the disclosure refers to a microwave plasma chamber, any remote plasma source, inductively coupled plasma (ICP) source, capacitively coupled plasma source (CCP) source, or microwave plasma source may be implemented in the disclosed processes.

In some embodiments, the processing tool 280 comprises a processing chamber 278 that is sealed by the assembly 270. For example, the assembly 270 may rest against one or more O-rings 281 to provide a vacuum seal to a chamber volume 283 of the processing chamber 278. In other embodiments, the assembly 270 interfaces with the processing chamber 278. Stated differently, in some embodiments, the assembly 270 may be part of a lid that seals the processing chamber 278. In some embodiments, a chuck 279, such as an electrostatic chuck, may support a workpiece 274 (e.g., wafer, substrate, etc.).

In some embodiments, the assembly 270 may comprise a monolithic source array 250, a housing 272, and a lid plate 276. The monolithic source array 250 may comprise a dielectric plate 260 and a plurality of protrusions 266 extending up from the dielectric plate 260. While a monolithic source array 250 is shown, it will be appreciated that the protrusions 266 may be distinct from the dielectric plate 260. The protrusions 266 may be isolated bodies that sit on top of the dielectric plate 260. In some embodiments, there may be five or more protrusions 266, or ten or more protrusions 266. In some embodiments, there are 19 protrusions 266.

The protrusions 266 may include any suitable material known to the skilled artisan. In some embodiments, the protrusions 266 comprise a dielectric material. In some embodiments, the protrusions 266 function as dielectric resonators in order to couple microwaves into the chamber volume 283. In some embodiments, as used herein, the protrusions 266 may be referred to as "applicators," or "plasma applicators," or "microwave applicators."

In some embodiments, the housing 272 includes openings sized to receive the protrusions 266. The housing 272 may be a conductive material. In some embodiments, the housing 272 is grounded. In the illustrated embodiment of FIG. 2, the housing 272 is directly supported by the dielectric plate 260, but it will also be appreciated that a thermal interface material or the like may separate the housing 272 from the dielectric plate 260. In some embodiments, monopole antennas 268 may extend into holes in the protrusions 266. In some embodiments, the holes in the protrusions 266 are larger than the monopole antennas 268 in order to allow for thermal expansion in order to prevent damage to the monolithic source array 250. In some embodiments, the monopole antennas 268 pass through a lid plate 276 over the housing 272 and the protrusions 266. In one or more embodiments, each of the monopole antennas 268 are coupled to different power sources. The skilled artisan will appreciate that the power sources can have any suitable construction.

The chamber volume 283 is suitable for striking a plasma 282. Stated differently, the chamber volume 283 may be a vacuum chamber. In some embodiments, a vacuum source may be fluidically coupled to the chamber volume 283. In order to strike the plasma 282, processing gases may be flown into the chamber volume 283. The processing gases may enter the assembly 270 via one or more gas lines 218. The processing gas then passes through a hole 214 through the lid plate 276 and enters a hole 235 in the housing 272. The hole 235 intersects a gas distribution channel 230 that laterally distributes the processing gas. While shown as a plurality of discrete gas distribution channels 230, it will be appreciated by the skilled artisan that the gas distribution channels 230 are fluidically coupled to each other out of the plane of FIG. 2.

The processing gas exits the channel 230 through groups 232 of holes 237 in a cover over the channel 230. The processing as then passes through gas distribution holes 263 through the dielectric plate 260 of the monolithic source array 250 and enters the chamber volume 283.

In some embodiments, the processing tool 280 includes a component configured to generate optical radiation. The skilled artisan will appreciate that any optical radiation source that is suitable for generating the optical radiation may be implemented for the disclosed processes.

In one or more unillustrated embodiments, the processing tool 280 includes a lid on top of the processing chamber 278. In some embodiments, the lid comprises optical radiation lamps that generate the optical radiation. In one or more unillustrated embodiments, the processing tool 280 includes a load lock chamber that comprises optical radiation lamps that generate the optical radiation.

Figure 3:
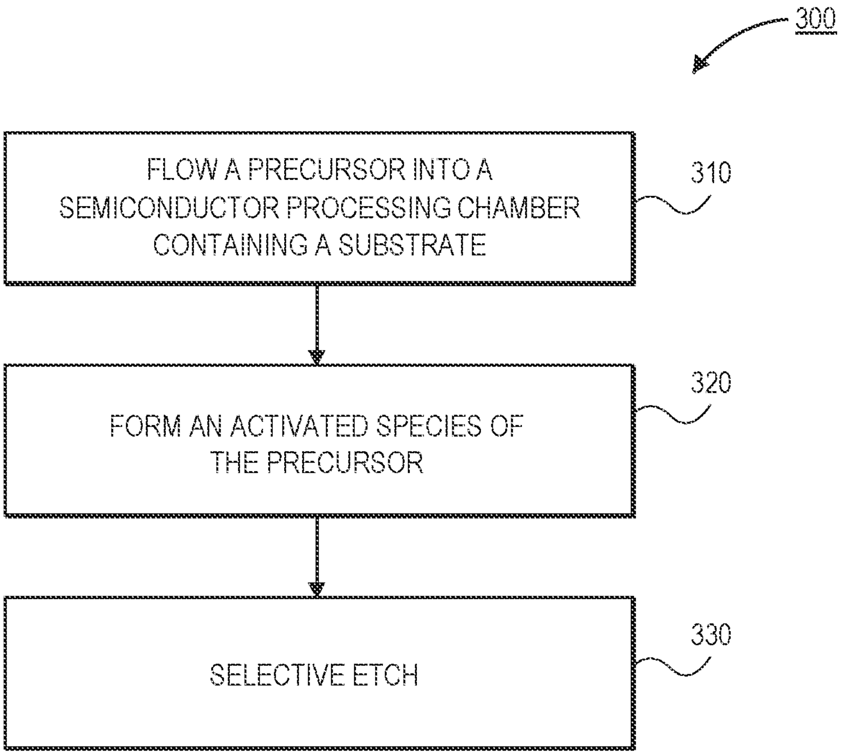
FIG. 3 illustrates a process flow diagram of a method of selectively etching silicon nitride relative to silicon oxide, in accordance with one or more embodiments of the disclosure.

FIG. 3 illustrates a process flow diagram of a method 300 of selectively etching silicon nitride relative to silicon oxide, in accordance with one or more embodiments of the disclosure.

In some embodiments, the method 300 includes a pre-treatment operation (not shown). The pre-treatment can include any suitable pre-treatment process known to the skilled artisan. Suitable pre-treatment processes include, but are not limited to, pre-heating, cleaning, soaking, metal oxidation, or depositing a protective layer to block the bottom of the trench.

In some embodiments, the method 300 is a selective etch method for a 3D structure. The 3D structure may be a 3D-NAND structure, or, more particularly, an intermediate structure used in the fabrication of a 3D-NAND structure. In some embodiments, the 3D structure is the structure described above with respect to FIG. 1A. While a particular 3D structure is described as an example, it will be appreciated by the skilled artisan that any architecture with a silicon nitride layer and an oxide layer may be provided in the processing chamber in accordance with various embodiments.

In some embodiments, the method 300 begins at operation 310, which includes flowing a precursor into a semiconductor processing chamber containing a substrate. In some embodiments, the precursor includes an etching chemistry comprising one or more of an interhalogen, a halogen-containing species, or a pseudohalogen species. In some embodiments, the etching chemistry comprises a mixture of the interhalogen and the halogen-containing species, a mixture of the interhalogen and the pseudohalogen species, or a mixture of the halogen-containing species and the pseudohalogen species.

In some embodiments, the precursor comprises a mixture of one or more of the interhalogen, the halogen-containing species, or the pseudohalogen species and an amine or a phosphine, or a mixture of one or more of the interhalogen, the halogen-containing species, or the pseudohalogen species and a sulfur-containing species.

In specific embodiments, the precursor comprises a mixture of the interhalogen and the amine or the phosphine. In specific embodiments, the precursor comprises a mixture of the interhalogen and sulfur-containing species.

In specific embodiments, the precursor comprises a mixture of the halogen-containing species and the amine or the phosphine. In specific embodiments, the precursor comprises a mixture of the halogen-containing species and sulfur-containing species.

In specific embodiments, the precursor comprises a mixture of the pseudohalogen species and the amine or the phosphine. In specific embodiments, the precursor comprises a mixture of the pseudohalogen species and sulfur-containing species.

As used herein, the term "interhalogen" refers to a species that includes 2 or more different halogen atoms and does not include atoms or elements of any other group in the Periodic Table. The interhalogen may include any suitable interhalogen as described herein known to the skilled artisan. In some embodiments, the interhalogen comprises one or more of chlorine trifluoride ($ClF_3$), bromine trifluoride ($BrF_3$), bromine pentafluoride ($BrF_5$), iodine trifluoride ($IF_3$), iodine pentafluoride ($IF_5$), iodine monobromide (IBr), or iodine monochloride (ICl).

In one or more embodiments, the halogen-containing species comprises one or more of fluorine ($F_2$), bromine ($Br_2$), chlorine ($Cl_2$), iodine ($I_2$), boron trifluoride ($BF_3$), or boron trichloride ($BCl_3$).

In one or more embodiments, the pseudohalogen species comprises one or more of an isocyano group, a sulfanyl group, a cyanate group, an isocyanate group, a thiocyanate group, or an isothiocyanate group. The pseudohalogen species may include any suitable compound that comprises one or more of an isocyano group, a sulfanyl group, a cyanate group, an isocyanate group, a thiocyanate group, or an isothiocyanate group. In some embodiments, the pseudohalogen species comprising one or more of an isocyano group, a sulfanyl group, a cyanate group, an isocyanate group, a thiocyanate group, or an isothiocyanate group further comprises an alkyl group, including, but not limited to an acyclic group, such as a linear alkyl group or a branched alkyl group, and a cyclic alkyl group.

In one or more specific embodiments, the pseudohalogen species comprising an isocyano group is

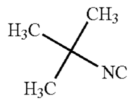

(t-butyl isocyanide). In one or more specific embodiments, the pseudohalogen species comprising a sulfanyl group is hydrogen sulfide ($H_2S$).

In one or more specific embodiments, the pseudohalogen species comprising an isocyanate group is

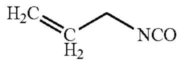

(1-propylene isocyanate).

In one or more specific embodiments, the pseudohalogen species comprising a thiocyanate group is $H_3CSCN$ (methyl thiocyanate).

In one or more specific embodiments, the pseudohalogen species comprising an isothiocyanate group is $H_3CH_2CNCS$ (ethyl isocyanate).

In some embodiments, the precursor flowed at operation 310 includes an etching chemistry and a passivating chemistry. In embodiments where the precursor comprises a mixture of the interhalogen and the amine or the phosphine, a mixture of the interhalogen and the sulfur-containing species, a mixture of the halogen-containing species and the amine or the phosphine, a mixture of the halogen-containing species and the sulfur-containing species, a mixture of the pseudohalogen and the amine or the phosphine, or a mixture of the pseudohalogen and the sulfur-containing species, each of the interhalogen, the halogen-containing species, and the pseudohalogen constitutes the etching chemistry and each of the amine, phosphine, and sulfur-containing species constitute the passivating chemistry.

The amine or the phosphine may include any suitable compound that contains an amine group and/or a phosphine group known to the skilled artisan. In one or more embodiments, the amine comprises one or more of diethylamine or triethylamine. In one or more embodiments, the phosphine comprises an alkylphosphine, such as a methylphosphine.

In one or more embodiments, the sulfur-containing species comprises one or more of hydrogen sulfide ($H_2S$) or carbon disulfide ($CS_2$). In one or more embodiments, the sulfur-containing species comprises a disulfide bonded molecule. In some embodiments, the disulfide bonded molecule comprises one or more of Me-S—S-Me (dimethyl disulfide), Cl—S—S—Cl (disulfur dichloride), or

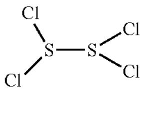

(disulfur tetrachloride).

The method 300, at operation 310, the etching chemistry etches the silicon nitride layers 104 relative to the silicon oxide layers 103. In some embodiments, the passivating chemistry forms a passivation layer over the exposed portions of the silicon oxide layers 103 to protect the silicon oxide layers 103. Stated differently, the passivating chemistry may be provided without etching the structure. In some embodiments, the passivating chemistry facilitates healing of the etched surfaces. In some embodiments, the passivating chemistry limits, prevents, or regenerates silicon oxide, which may maintain the silicon oxide layers 103 during the etching chemistry.

In specific embodiments, one or more of the interhalogen, the halogen-containing species, or the pseudohalogen species etches the silicon nitride layers 104 relative to the silicon oxide layers 103, and one or more of the amine, phosphine, or sulfur-containing species independently form a passivation layer over the exposed portions of the silicon oxide layers 103 to protect the silicon oxide layers 103.

In some embodiments, at operation 320, the method 300 includes forming an activated species (e.g., radicals) of the precursor.

Without intending to be bound by any particular theory, it is thought that the etching chemistry and the passivating chemistry are aided in their effectiveness by forming an activated species of the precursor to implement the respective chemistries.

It has been advantageously found that forming the activated species of the precursor weakens the underlying bonds of the silicon nitride layers 104, allowing the silicon nitride layers 104 to be removed.

In some embodiments, forming the activated species comprises one or more of a thermal process, generating a plasma of the precursor, or heating the substrate to a temperature of less than or equal to 500° C. using an optical radiation source.

The thermal process may include any suitable process known to the skilled artisan that does not employ a plasma.

Any suitable plasma source can be used to generate a plasma of the precursor. In one or more embodiments, a remote plasma source, an inductively coupled plasma (ICP) source, a capacitively coupled plasma (CCP) source, or a microwave plasma source may be used to generate the plasma of the precursor.

The skilled artisan will appreciate that any remote plasma source, inductively coupled plasma (ICP) source, capacitively coupled plasma source (CCP) source, or microwave plasma source that is suitable for generating the plasma may be implemented for the disclosed processes.

One or more embodiments of the present disclosure include modular microwave plasma processing tools, such as processing tool 280, for selectively etching silicon nitride relative to silicon oxide. Modular microwave plasma sources have a high plasma density and very low plasma potential (e.g., less than or equal to 10 eV). The high plasma density and low plasma potential results in less sputtering damage to the etched structure as compared to a typical inductively coupled plasma (ICP) source, as an example, which has a higher plasma potential (e.g., greater than or equal to about 20 eV).

One or more embodiments of the present disclosure heating the substrate to a temperature of less than or equal to 500° C. using an optical radiation source. As used herein, the term "optical radiation" includes ultraviolet (UV) wavelengths, visible light wavelengths, and infrared (IR) wavelengths on the electromagnetic spectrum. In one or more embodiments, the IR radiation used has a wavelength in a range of from 780 nm to 1 mm. In one or more embodiments, the UV-visible light radiation has a wavelength in a range of from 190 nm to 900 nm.

The optical radiation may be generated by any suitable source known to the skilled artisan. In some embodiments, the optical radiation employed to form the activated species of the precursor is UV radiation, visible light radiation, or IR radiation. In some embodiments, the optical radiation employed to form the activated species of the precursor is UV radiation.

The method 300 includes flowing the precursor (operation 310) and forming an activated species (e.g., radicals) of the precursor (operation 320) to advantageously etch the silicon nitride layers 104 relative to the silicon oxide layers 103 (operation 330, which includes operations 310 and 320) with improved etching selectivity.

In some embodiments, the semiconductor processing chamber is maintained at a pressure in a range of from 5 millitorr to 100 Torr during formation of the activated species. In some embodiments, the pressure is in a range of from 5 millitorr to 20 Torr, in a range of from 5 millitorr to 10 Torr, or in a range of from 5 millitorr to 5 Torr during formation of the activated species. In some embodiments, the semiconductor processing chamber is maintained at a temperature of less than or equal to 500° C. during formation of the activated species.

In some embodiments, a distance between the plasma source and the substrate with the 3D structure may be less than or equal to 5 inches (12.7 cm), less than or equal to 1 inch (2.54 cm), less than or equal to 0.25 inches (0.635 cm), or less than or equal to 0.1 inches (0.254 cm). In some embodiments, the plasma may be generated from a plurality of plasma applicators, such as the structure shown in FIG. 2.

In some embodiments, a microwave power source provides the microwave plasma at a power of at least 50 Watts per cycle. In some embodiments, the method 300 is repeated, and a plurality of cycles of providing microwave plasma are performed. In some embodiments, the method 300 is repeated until the microwave power source provides a total delivered power of 1500 Watts. In some embodiments, the method 300 is repeated until the microwave power source provides a total delivered power of 2250 Watts. In some embodiments, the method 300 is repeated until the microwave power source a total delivered power of 2850 Watts. In some embodiments, the method 300 is repeated until the microwave power source provides a total delivered power of 5000 Watts. Accordingly, the total delivered power from the microwave power source is in a range of from 50 Watts to 5000 Watts.

In some embodiments, a distance between the optical radiation source and the substrate with the 3D structure may be less than or equal to 5 inches (12.7 cm), less than or equal to 1 inch (2.54 cm), less than or equal to 0.25 inches (0.635 cm), or less than or equal to 0.1 inches (0.254 cm).

In some embodiments, the method 300 includes flowing precursor and forming an activated species of the precursor (operations 310 and 320), for a time period in a range of from 5 seconds to 10 minutes. In some embodiments, the method 300 optionally includes purging the semiconductor processing chamber (not shown) of the precursor and the activated species of the precursor.

As used herein, purging the semiconductor processing chamber removes unreacted precursors, gas mixtures, reaction products, and by-products. For example, in a sector of a spatially separated processing chamber, the portion of the processing chamber adjacent the substrate surface is purged of the unreacted precursor by any suitable technique including, but not limited to, moving the substrate through a gas curtain to a portion or sector of the processing chamber that contains none or substantially none of the precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

In one or more embodiments, the purge gas comprises one or more of argon (Ar), helium (He), krypton (Kr), neon (Ne), xenon (Xe), hydrogen ($H_2$), oxygen ($O_2$), or nitrogen ($N_2$). In some embodiments, purging the semiconductor processing chamber includes flowing the purge gas (e.g., helium (He)) over the substrate for a time period in a range of from 0.5 seconds to 10 minutes.

In one or more embodiments, the method 300 includes a cyclical process of flowing the precursor (operation 310), purging, forming the activated species of the precursor (operation 320), purging, then continuing with the method 300.

In some embodiments, the method 300 flowing one or more of the interhalogen, the halogen-containing species, or the pseudohalogen species, sequentially, or co-flowed, (operation 310), purging, forming the activated species of the precursor (operation 320), purging, then continuing with the method 300. In one or more embodiments, one or more of the interhalogen, the halogen-containing species, or the pseudohalogen species are flowed at operation 310, activated at operation 320, and used to selectively etch silicon nitride relative to silicon oxide at operation 330 without purging.

In embodiments where the precursor comprises a mixture of the interhalogen and the amine or the phosphine, the interhalogen and the amine or the phosphine may be flowed sequentially, or co-flowed. In embodiments where the precursor comprises the mixture of the interhalogen and the amine or the phosphine, the interhalogen and the amine or the phosphine may be flowed without purging. In one or more embodiments, the method 300 includes flowing the interhalogen, purging, flowing the amine or the phosphine, purging, then continuing with the method 300.

In embodiments where the precursor comprises a mixture of the interhalogen and the sulfur-containing species, the interhalogen and the sulfur-containing species may be flowed sequentially, or co-flowed. In embodiments where the precursor comprises the mixture of the interhalogen and the sulfur-containing species, the interhalogen and the sulfur-containing species may be flowed without purging. In one or more embodiments, the method 300 includes flowing the interhalogen, purging, flowing the sulfur-containing species, purging, then continuing with the method 300.

In embodiments where the precursor comprises a mixture of the halogen-containing species and the amine or the phosphine, the halogen-containing species and the amine or the phosphine may be flowed sequentially, or co-flowed. In embodiments where the precursor comprises a mixture of the halogen-containing species and the amine or the phosphine, the halogen-containing species and the amine or the phosphine may be flowed without purging. In one or more embodiments, the method 300 includes flowing the halogen-containing species, purging, flowing the amine or the phosphine, purging, then continuing with the method 300.

In embodiments where the precursor comprises a mixture of the halogen-containing species and the sulfur-containing species, the halogen-containing species and the sulfur-containing species may be flowed sequentially, or co-flowed. In embodiments where the precursor comprises the mixture of the halogen-containing species and the sulfur-containing species, the halogen-containing species and the sulfur-containing species may be flowed without purging. In one or more embodiments, the method 300 includes flowing the halogen-containing species, purging, flowing the sulfur-containing species, purging, then continuing with the method 300.

In embodiments where the precursor comprises a mixture of the pseudohalogen species and the amine or the phosphine, the pseudohalogen species and the amine or the phosphine may be flowed sequentially, or co-flowed. In embodiments where the precursor comprises the mixture of the pseudohalogen species and the amine or the phosphine, the pseudohalogen species and the amine or the phosphine may be flowed without purging. In one or more embodiments, the method 300 includes flowing the pseudohalogen species, purging, flowing the amine or the phosphine, purging, then continuing with the method 300.

In embodiments where the precursor comprises a mixture of the pseudohalogen species and the sulfur-containing species, the pseudohalogen species and the sulfur-containing species may be flowed sequentially, or co-flowed. In embodiments where the precursor comprises the mixture of the pseudohalogen species and the sulfur-containing species, the pseudohalogen species and the sulfur-containing species may be flowed without purging. In one or more embodiments, the method 300 includes flowing the pseudohalogen species, purging, flowing the sulfur-containing species, purging, then continuing with the method 300.

In some embodiments, at operation 330, the method 300 includes selectively etching the substrate. The operation 330 includes the processes described in operations 310 and 320, that, when implemented together in a process cycle, achieve improved etching selectivity.

In one or more embodiments, an etching selectivity of silicon nitride to silicon oxide is greater than or equal to 500:1, greater than or equal to 700:1, greater than or equal to 1000:1, greater than or equal to 1200:1, or greater than or equal to 1600:1.

In some embodiments, such as when the substrate is the substrate 101 shown in FIG. 1A, the substrate 101 has a plurality of alternating layers of silicon oxide 103 and silicon nitride 104 thereon and a trench 106 formed through the plurality of alternating layers. In some embodiments, at operation 350, the silicon nitride layers 104 are selectively etched relative to the silicon oxide layers 103.

It is thought that implementing the method 300 improves the etching uniformity in highly scaled 3D-NAND devices, such as in structures with high aspect ratios and many silicon nitride layers 104 and silicon oxide layers 103, such that the etching is substantially uniform at the top of the structure and the bottom of the structure. The etching processes of one or more embodiments advantageously provides complete removal of the silicon nitride layers 104 without significantly damaging the silicon oxide layers 103. For example, the etch rate of silicon nitride at a top of a 3D NAND structure may be substantially similar to an etch rate of silicon nitride at a bottom of the 3D NAND structure. In some embodiments, a ratio of the etch rate of silicon nitride between the top of the structure and the bottom of the structure may be in a range of from about 5:1 to about 1:1.

It will be appreciated by the skilled artisan that the etching temperatures (i.e., substrate temperatures) for embodiments disclosed herein may be considered low temperature processes. In some embodiments, the semiconductor processing chamber is maintained at a temperature of less than or equal to 500° C., less than or equal to 400° C., less than or equal to 300° C., less than or equal to 200° C., less than or equal to 100° C., less than or equal to 50° C., less than or equal to 0° C., less than or equal to −50° C., or less than or equal to −100° C. It will be appreciated by the skilled artisan that maintaining the semiconductor chamber at a temperature of less than or equal to 100° C., such as in the range of from less than or equal to 100° C. to less than or equal to −100° C., will require the implementation of additional processing equipment, such as a cryogenic chamber.

While the method 300 is described as including discrete processing operations (operations 310-320) in order to selectively etch the substrate at operation 330, the disclosure is not limited thereto. For example, the method 300 may include any combination of the plurality of chemistries (the etching chemistries and the passivating chemistries).

One or more embodiments of the disclosure are directed to a non-transitory computer readable medium including instructions, that, when executed by a controller of a processing chamber, cause the processing chamber to perform one or more of the illustrated and unillustrated operations of method 300 as described herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments." "one or more embodiments"

or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively etching silicon nitride relative to silicon oxide, the method comprising:

flowing a precursor comprising a mixture of one or more of an interhalogen, a halogen-containing species, a pseudohalogen species, and an amine or a phosphine, into a semiconductor processing chamber containing a substrate, the substrate having a plurality of alternating layers of silicon oxide and silicon nitride thereon and a trench formed through the plurality of alternating layers;

forming an activated species of the precursor; and etching the substrate, wherein the silicon nitride layers are selectively etched relative to the silicon oxide layers and an etching selectivity of silicon nitride to silicon oxide is greater than or equal to 500:1.

2. The method of claim 1, wherein the interhalogen comprises one or more of chlorine trifluoride ($ClF_3$), bromine trifluoride ($BrF_3$), bromine pentafluoride ($BrF_5$), iodine trifluoride ($IF_3$), iodine pentafluoride ($IF_5$), iodine monobromide (IBr), or iodine monochloride (ICl).

3. The method of claim 1, wherein the halogen-containing species comprises one or more of fluorine ($F_2$), bromine ($Br_2$), chlorine ($Cl_2$), iodine ($I_2$), boron trifluoride ($BF_3$), or boron trichloride ($BCl_3$).

4. The method of claim 1, wherein the amine is diethylamine or triethylamine.

5. The method of claim 1, wherein the phosphine is an alkylphosphine.

6. The method of claim 1, wherein the pseudohalogen species comprises one or more of an isocyano group, a sulfanyl group, a cyanate group, an isocyanate group, a thiocyanate group, or an isothiocyanate group.

7. The method of claim 1, wherein flowing the precursor of the mixture of the interhalogen and the amine or the phosphine, the mixture of the halogen-containing species and the amine or the phosphine, or the mixture of the pseudohalogen species and the amine or the phosphine comprises sequentially exposing the substrate to the interhalogen, the halogen-containing species, or the pseudohalogen species, respectively, and the amine or the phosphine.

8. The method of claim 1, wherein the semiconductor processing chamber is maintained at a pressure in a range of from 5 millitorr to 100 Torr.

9. The method of claim 1, wherein the semiconductor processing chamber is maintained at a temperature of less than or equal to 500° C.

10. The method of claim 1, further comprising purging the semiconductor processing chamber with a purge gas.

11. The method of claim 10, wherein the purge gas comprises one or more of argon (Ar), helium (He), krypton (Kr), neon (Ne), xenon (Xe), hydrogen ($H_2$), oxygen ($O_2$), or nitrogen ($N_2$).

12. The method of claim 1, wherein forming the activated species comprises one or more of a thermal process, generating a plasma of the precursor, or heating the substrate to a temperature of less than or equal to 500° C. using an optical radiation source.

13. The method of claim 12, wherein the plasma is generated by one or more of a microwave plasma source, a remote plasma source, an inductively coupled plasma (ICP) source, or a capacitively coupled plasma (CCP) source.

14. The method of claim 12, wherein the activated species is generated by UV radiation.

15. A method of selectively etching silicon nitride relative to silicon oxide, the method comprising:

flowing a precursor comprising a mixture of one or more of an interhalogen, a halogen-containing species, a pseudohalogen species, and a sulfur-containing species comprising a disulfide bonded molecule including one or more of Me-S—S-Me (dimethyl disulfide) or

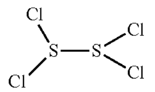

(disulfur tetrachloride), into a semiconductor processing chamber containing a substrate, the substrate having a plurality of alternating layers of silicon oxide and silicon nitride thereon and a trench formed through the plurality of alternating layers;

forming an activated species of the precursor; and etching the substrate, wherein the silicon nitride layers are selectively etched relative to the silicon oxide layers.

16. The method of claim 15, wherein forming the activated species comprises one or more of a thermal process, forming a plasma of the precursor, or heating the substrate to a temperature of less than or equal to 500° C. using an optical radiation source.

17. The method of claim 16, wherein the plasma is generated by one or more of a microwave plasma source, a remote plasma source, an inductively coupled plasma (ICP) source, or a capacitively coupled plasma (CCP) source.

18. The method of claim 16, wherein the activated species is generated by UV radiation.

19. A method of selectively etching silicon nitride relative to silicon oxide, the method comprising:

flowing a precursor into a semiconductor processing chamber containing a substrate, the precursor comprising a pseudohalogen species, a mixture of the pseudohalogen species and an amine or a phosphine, or a mixture of the pseudohalogen species and a sulfur-containing species, the pseudohalogen species comprising one or more of an isocyano group, a cyanate group, an isocyanate group, a thiocyanate group, or an isothiocyanate group, the substrate having a plurality of alternating layers of silicon oxide and silicon nitride thereon and a trench formed through the plurality of alternating layers;

forming an activated species of the precursor; and etching the substrate, wherein the silicon nitride layers are selectively etched relative to the silicon oxide layers and an etching selectivity of silicon nitride to silicon oxide is greater than or equal to 500:1.

* * * * *